(12) United States Patent
Sirito-Olivier et al.

(10) Patent No.: US 9,705,400 B2
(45) Date of Patent: Jul. 11, 2017

(54) RECONFIGURABLE OUTPUT STAGE

(71) Applicant: Optis Circuit Technology, LLC, Plano, TX (US)

(72) Inventors: Philippe Sirito-Olivier, Saint Egreve (FR); Patrizia Milazzo, S. Agata Li Battiati (IT); Angelo Nagari, Grenoble (FR)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 24 days.

(21) Appl. No.: 14/889,892

(22) PCT Filed: Jun. 2, 2014

(86) PCT No.: PCT/EP2014/061350
§ 371 (c)(1),
(2) Date: Nov. 9, 2015

(87) PCT Pub. No.: WO2014/195258
PCT Pub. Date: Dec. 11, 2014

(65) Prior Publication Data
US 2016/0118892 A1 Apr. 28, 2016

(30) Foreign Application Priority Data

Jun. 3, 2013 (EP) .................................... 13305740

(51) Int. Cl.
*H04R 27/00* (2006.01)
*H04R 3/12* (2006.01)
(Continued)

(52) U.S. Cl.
CPC .......... *H02M 3/158* (2013.01); *H03F 3/2173* (2013.01); *H03F 3/2175* (2013.01)

(58) Field of Classification Search
CPC .... H04R 5/04; H04R 1/1041; H04R 2420/03; H04R 2420/01; G10K 11/1786;
(Continued)

(56) References Cited

FOREIGN PATENT DOCUMENTS

EP 0 369 954 A1 5/1990
EP 1 526 643 A1 4/2005

OTHER PUBLICATIONS

International Search Report issued in corresponding International application No. PCT/EP2014/061350, date of completion of the International search Jun. 30, 2014.
(Continued)

*Primary Examiner* — George Monikang
(74) *Attorney, Agent, or Firm* — The Danamraj Law Group, P.C.; Thomas L. Crisman; Kenneth A. McClure

(57) ABSTRACT

An output stage configuration with four configurable input/output terminals and four switches is specified. Each switch has a first main terminal, a second main terminal and a control terminal, which receives a control signal for controlling the open or closed state of the switch. The output stage is included in a circuit together with a first control apparatus and a second control apparatus. When a control stage of the first control apparatus is connected to the output stage, a control stage of the second control apparatus is electrically disconnected from the output stage, and the output stage operates in a first operating state. When the control stage of the second control apparatus is connected to the output stage, the control stage of the first control apparatus is electrically disconnected from the output stage, the output stage then operating in a second operating state.

15 Claims, 4 Drawing Sheets

(51) Int. Cl.
  *H04R 5/04* (2006.01)
  *H02M 3/158* (2006.01)
  *H03F 3/217* (2006.01)

(58) Field of Classification Search
  CPC .. H03F 3/217; H03F 3/2173; H03F 2200/249; H03F 2200/414; H03F 3/2178; H03F 2203/7231
  USPC .................................. 381/28, 80–81, 84–85
  See application file for complete search history.

(56) References Cited

OTHER PUBLICATIONS

Written Opinion of the International Searching Authority issued in corresponding International application No. PCT/EP2014/061350, date of mailing Jul. 7, 2014.
Extended European Search Report issued in corresponding European patent application No. EP 13 30 5740, date of completion of the report Sep. 6, 2013.

RECONFIGURABLE OUTPUT STAGE

TECHNICAL FIELD

The proposed solution relates generally to output stage circuits, and more especially to a reconfigurable output stage.

BACKGROUND ART

Recently, designers of portable and other low power electronic devices have devised multimedia features in order for their products to attract more attention from potential customers. Internally to these devices, subsystem circuits such as audio subsystems have an increasingly important role on the realisation of these features and, thus, on user experience.

A typical audio subsystem, for instance, may combine in a single integrated circuit, various audio configurations for driving multiple output speakers such as a headphone, a hands-free loudspeaker and a receiver speaker, each of these audio configurations potentially having respective output power requirements. For instance, an audio subsystem may use a Class-D amplifier in different audio configurations for driving a circuit such as a hands-free loudspeaker. In fact, depending on the user's need and due to its high power and high efficiency, a Class-D amplifier may provide different levels of loudness. For example, when a medium loudness is required, e.g. 1 W, the Class-D amplifier may be powered by the battery of the device. In this configuration the sound loudness would depend on the battery charge state. In another example, when a high loudness is required, e.g. 2 W, the Class-D amplifier may be powered by a DC-DC boost converter. In this configuration, the sound loudness could be constant whatever the battery charge state.

However, with such type of audio subsystems, when only the medium loudness audio configuration is used the DC-DC boost converter is not used. This is inefficient and represents extra subsystems costs due to the unused die area.

SUMMARY

There is thus a need for an improved subsystem circuit structure which maximises the die area usage and thus reduce the subsystem costs. Therefore, it is proposed an output stage suitable for use in a subsystem circuit which can be shared between at least two subsystem circuit components. Namely, the proposed output stage may be adapted to work with particular subsystem circuit components. Hence, with the above example of the audio subsystem and contrary to the prior art, only one output stage is needed for both the Class-D amplifier and the DC-DC boost converter within an audio subsystem circuit structure. In fact in the prior art, two output stages are needed, i.e. one output stage for each of the Class-D amplifier and the DC-DC boost converter.

In a first aspect of the solution described herein, there is proposed an electronic circuit output stage adapted to operate in at least a first operating state and a second operating state, the output stage comprising:
 a first, a second, a third and a fourth configurable input/output terminals; and,
 a first, a second, a third and a fourth switches, each having a first main terminal, a second main terminal and a control terminal, the control terminal being adapted to receive a control signal for controlling the open or closed state of the switch;

wherein,
 the first input/output terminal is connected to the first main terminal of the first switch;
 the second input/output terminal is connected to the first main terminal of the second switch;
 the second main terminal of the first switch is connected to the first main terminal of the third switch through a first branch,
 the second main terminal of the second switch is connected to the first main terminal of the fourth switch through a second branch;
 the third input/output terminal is connected to the first branch and the fourth input/output terminal is connected to the second branch;
 the second main terminals of the third and fourth switches are both connected to a common node receiving a reference potential; and, wherein,
 when the first and second input/output terminals are configured to operate as input terminals, the third and fourth input/output terminals are configured to operate as output terminals; and,
 when the first and second input/output terminals are configured to operate as output terminals, the third and fourth input/output terminals are configured to operate as input terminals; and, wherein,
 in the first operating state, the output stage is arranged in a first electrical configuration; and
 in the second operating state wherein the output stage is arranged in a second electrical configuration different from the first configuration In a first embodiment of the first aspect, in the first operating state:
 the first and second input/output terminals are configured to operate as input terminals and are configured to be connected to a common node receiving a supply potential; and,
 the third and fourth input/output terminals are configured to be connected to a load element.

Advantageously, this embodiment may allow creating a class-D configuration.

In a second embodiment of the first aspect, in the second operating state, the output stage may further comprise an inductor and a decoupling capacitor, wherein:
 the first and second input/output terminals are configured to operate as output terminals and are configured to be connected, in series with a load element and in parallel with the decoupling capacitor;
 the third and fourth input/output terminals are short-circuited;
 one end of the inductor is configured to be connected to the short circuited third and fourth input/output terminals and another end the inductor is configured to be connected to a node receiving a supply potential.

Advantageously, this embodiment may allow creating a boost DCDC configuration.

In a third, alternative embodiment of the first aspect, in the second operating state, the output stage may further comprise an inductor and a decoupling capacitor, wherein:
 the first and second input/output terminals are configured to operate as input terminals and are configured to be connected to a common node receiving a supply potential;
 the third and fourth input/output terminals are short-circuited;
 one end of the inductor is configured to be connected to the short-circuited third and fourth input/output terminals and another end the inductor is configured to be connected, in series with a load element and in parallel with the decoupling capacitor.

Advantageously, this embodiment may allow creating a buck DCDC configuration.

In a fourth possible embodiment of the first aspect, in the second operating state, the output stage may further comprise a first and second inductor and a first and second decoupling capacitor, wherein:

the first and second input/output terminals are configured to operate as output terminals;

the first input/output terminal is configured to be connected, in series with a first load element and in parallel with the first decoupling capacitor;

the second input/output terminal is configured to be connected, in series with a second load element and in parallel with the second decoupling capacitor;

one end of the first inductor is configured to be connected to the third input/output terminal and another end of the first inductor is configured to be connected to a common node receiving a supply potential;

one end of the second inductor is configured to be connected to the fourth input/output terminal and another end of the second inductor is configured to be connected to the node receiving a supply potential.

Advantageously, this embodiment may allow creating a double boost DCDC.

In a fifth embodiment of the first aspect, in the second operating state, the output stage may further comprise a first and second inductor and a first and second decoupling capacitor, wherein:

the first and second input/output terminals are configured to operate as input terminals and are configured to be connected to a common node receiving a supply potential;

one end of the first inductor is configured to be connected to the third input/output terminal and another end of the first inductor is configured to be connected, in series with a first load element and in parallel with the first decoupling capacitor;

one end of the second inductor is configured to be connected to the fourth input/output terminal and another end of the second inductor is configured to be connected, in series with a second load element and in parallel with the second decoupling capacitor.

Advantageously, this embodiment may allow creating a double buck DCDC.

For instance, in a sixth embodiment of the first aspect, in the second operating state, the output stage may further comprise a first and second inductor and a first and second decoupling capacitor, wherein:

the first and second input/output terminals are configured to operate as input terminals;

the third input/output terminal is configured to be connected, in series with a first load element and in parallel with the first decoupling capacitor;

one end of the first inductor is configured to be connected to the first input/output terminal and another end of the first inductor is configured to be connected to a first node receiving a supply potential;

one end of the second inductor is configured to be connected to the fourth input/output terminal and another end of the second inductor is configured to be connected, in series with a second load element and in parallel with the second decoupling capacitor.

Advantageously, this embodiment may allow creating a double DCDC, comprising a buck configuration, and a boost configuration.

In a second aspect of the solution, there is proposed a control apparatus comprising:

a control stage configured to control an output stage according to the first embodiment of the first aspect.

In an embodiment of the second aspect, the control stage is a Class-D control stage.

In a third aspect of the solution, there is proposed a control apparatus comprising:

a control stage configured to control an output stage according to any one of the second to sixth embodiments of the first aspect.

In an embodiment of the third aspect, the control stage is a DC-DC converter control stage.

In an embodiment of second and/or third aspects, the control stage is adapted to control the output stage by generating control signals for controlling the first, second, third and fourth switches through their respective control terminals.

In a fourth aspect of the solution, there is proposed a circuit comprising:

an output stage according to any one of the first to the sixth embodiments of the first aspect;

a first control apparatus according to the second aspect wherein the control stage of the first control apparatus is connected to the output stage; and, a second control apparatus according to the third aspect wherein the control stage of the second control apparatus is connected to the output stage, wherein:

when the control stage of the first control apparatus is connected to the output stage, the control stage of the second control apparatus is electrically disconnected from the output stage, the output stage being configured to operate in the first operating state; and, when the control stage of the second control apparatus is connected to the output stage, the control stage of the first control apparatus is electrically disconnected from the output stage, the output stage being configured to operate in the second operating state.

In a fifth aspect of the solution, there is proposed a device comprising:

the circuit of the fourth aspect;

a battery configured to be connected to the input terminals of the circuit; and, a loudspeaker configured to be connected to the output terminals of the circuit.

In a sixth aspect of the solution, there is proposed the use of an output stage according to any one of the first to the sixth embodiments of the first aspect in conjunction with:

a first control apparatus according to the second aspect wherein the control stage of the first control apparatus is connected to the output stage; and, a second control apparatus according to the third aspect wherein the control stage of the second control apparatus is connected to the output stage, wherein:

when the control stage of the first control apparatus is connected to the output stage, the control stage of the second control apparatus is electrically disconnected from the output stage, the output stage being configured to operate in the first operating state; and, when the control stage of the second control apparatus is connected to the output stage, the control stage of the first control apparatus is electrically disconnected from the output stage, the output stage being configured to operate in the second operating state.

BRIEF DESCRIPTION OF DRAWINGS

A more complete understanding of the proposed solution may be obtained from a consideration of the following description in conjunction with the drawings, in which like reference numbers indicate same or similar elements. In the drawings.

DESCRIPTION OF EMBODIMENTS

The following detailed description is exemplary in nature and is not intended to limit the scope, applicability, or configuration of the invention in any way. Rather, the following description provides practical illustrations for implementing exemplary embodiments of the present invention. Examples of constructions, materials, dimensions, and manufacturing processes are provided for selected elements, and all other elements employ that which is known to those of skill in the field of the invention. Those skilled in the art will recognize that many of the examples provided have suitable alternatives that can be utilized.

Figure 1:
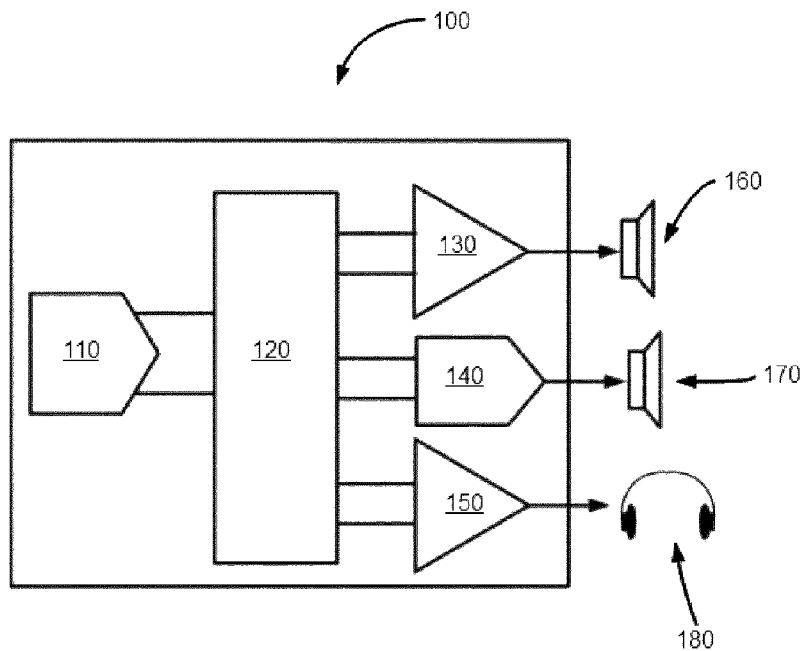
FIG. 1 is a block diagram illustrating an audio subsystem.

FIG. 1 is a block diagram schematically illustrating an audio subsystem 100.

In FIG. 1, there is shown therein the audio subsystem 100 comprising one audio DAC unit 110 (i.e. Digital to Analog Converter), one gain matrix unit 120, one class-AB amplifiers 130, two class-AB amplifiers 150, one Class-D amplifier 140, one ear speaker 160, one hands-free speaker 170 and one headphone 180. It is considered herein that there are two class-AB amplifiers 150 that can drive a stereo headphone.

Referring to FIG. 1, the audio DAC 110 is coupled to the gain matrix 120, which is coupled to the amplifiers 130, 140, 150, which are respectively coupled to the ear speaker 160, the hands-free speaker 170 and the headphone 180.

The DAC 110 aims at generating at least one audio signal which gain may be modified by the gain matrix 120 prior being amplified by an amplifier 130, 140, 150 and being reproduced by a speaker 160, 170, 180.

As stated above, the Class-D amplifier 140 may be used in different audio configurations depending on the user's need of loudness. However, different circuit components may be used in different audio configurations thus resulting in a waste of circuit die area when only one or more of the circuit components are in used while the others are not.

By way of example, let's consider a case where the Class-D amplifier 140 and a DC-DC boost converter are the circuit components used in one or more audio configurations to drive a speaker, 170. It is indicated that other configurations and other components may be used herein. Each of the Class-D amplifier 140 and the DC-DC boost converter is usually organised into two parts:

a output stage providing the required output; and, a control stage for controlling the output stage However in the proposed example, when the Class-D is used alone in the audio configuration (e.g. for a medium output loudness), only the control stage and output stage of the Class-D amplifier are used while the control stage and output stage of the DC-DC boost converter are not used. As stated above, this situation results in wastage of the circuit die area.

In order to solve this problem, it is proposed an electronic circuit output stage adapted to operate in at least a first operating state and a second operating state, such that the output stage may be shared by at least two circuit components such as the Class-D amplifier and the DC-DC boost converter. This way in the example proposed above, the proposed control stage would always be in used in all associated audio configurations.

Figure 2:
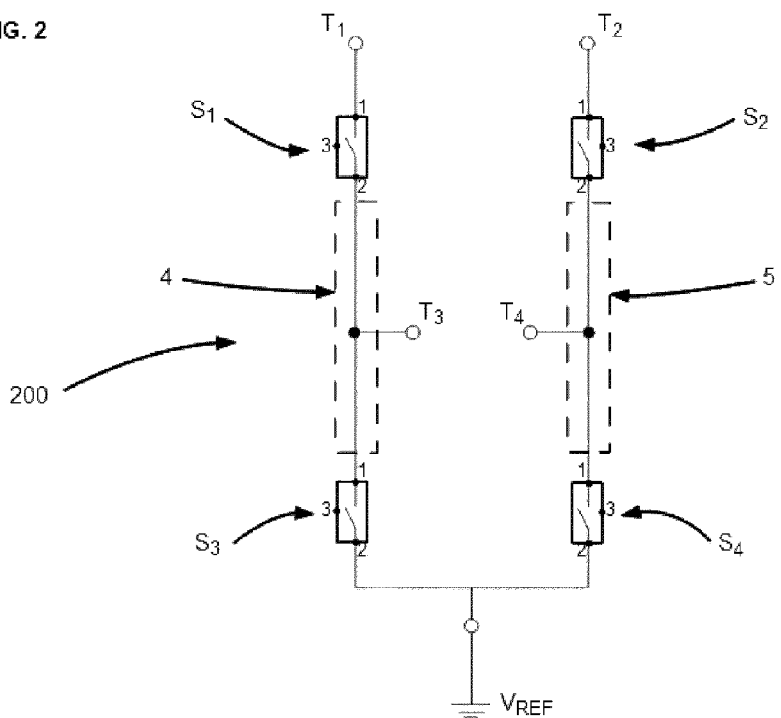
FIG. 2 is a block diagram illustrating an exemplary output stage of the proposed solution.

FIG. 2 is a block diagram schematically illustrating an exemplary output stage 200 according to the proposed solution.

In FIG. 2, there is shown therein the output stage 200 comprising:

a first configurable input/output terminal T1, a second configurable input/output terminal T2, a third configurable input/output terminal T3 and a fourth configurable input/output terminal T4; and, a first switch S1, a second switch S2, a third switch S3 and a fourth switch S4. The switches S1, S2, S3, S4 may be MOS transistors, NMOS transistors or other transistors of the same or different kind.

Referring to FIG. 2, the configurable input/output terminal T1, T2, T3, T4 are configured to operate as input or output terminals such that:

when the first input/output terminal T1 and second input/output terminal T2 are configured to operate as input terminals, the third input/output terminal T3 and fourth input/output terminal T4 are configured to operate as output terminals; and, when the first input/output terminal T1 and second input/output terminal T2 are configured to operate as output terminals, the third input/output terminal T3 and fourth input/output terminal T4 are configured to operate as input terminals.

Further in FIG. 2, each of the switches S1, S2, S3, S4 has a first main terminal 1, a second main terminal 2 and a control terminal 3 wherein the control terminal 3 is adapted to receive a control signal for controlling the open or closed state of the associated switch.

Structurally, the output stage 200 is organised as follows. The first input/output terminal T1 is connected to the first main terminal 1 of the first switch S1. The second input/output terminal T2 is connected to the first main terminal 1 of the second switch S2. The second main terminal 2 of the first switch S1 is connected to the first main terminal 1 of the third switch S3. The latter connection is forming a first branch 4 of the output stage 200. The second main terminal 2 of the second switch S2 is connected to the first main terminal 1 of the fourth switch s4. The latter connection is forming a second branch 5 of the output stage 200. The third input/output terminal T3 is connected to the first branch 4 of the output stage 200 and the fourth input/output terminal T4 is connected to the second branch 5 of the output stage 200. The second main terminal 2 of the third switch S3 and the second main terminal 2 of fourth switches S4 are both connected to a common node receiving a reference potential VREF of the output stage 200.

Referring to FIG. 2, when in the first operating state, the output stage is arranged in a first electrical configuration, and when in the second operating state wherein the output stage is arranged in a second electrical configuration different from the first configuration.

Figure 3:
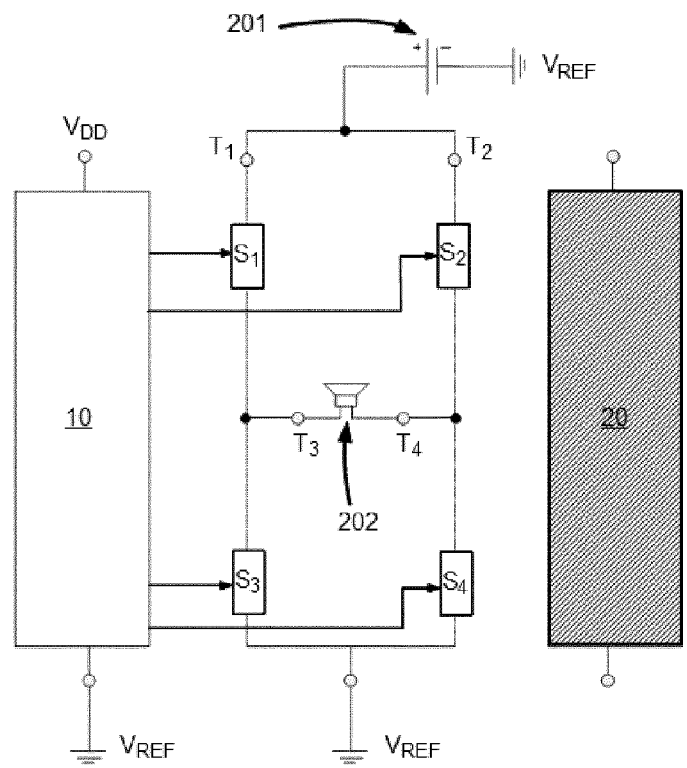
FIGS. 3-8 are a block diagrams illustrating embodiments of the proposed solution.

FIG. 3 is a block diagram schematically illustrating a first exemplary embodiment of the proposed solution wherein the output stage 200 of FIG. 2 is used, in the first operating state.

In the example of FIG. 3, the first input/output terminal T1 and second input/output terminal T2 are configured to operate as input terminals and are also configured to be connected to a common node receiving a supply potential 201. The common node receiving a supply potential 201 may be a battery, a DC-DC boost converter or any similar DC power source which needs to be recharged on a periodic basis. Further, in FIG. 3, the third input/output terminal T3 and fourth input/output terminal T4 are configured to be connected to a load element. For example, the load element may be an audio speaker 202. In such case, the third input/output terminal T3 and fourth input/output terminal T4 may be connected respectively with a first and second end of the audio speaker 202. In another example, the load element may be a motor such as a vibration motor usually used in mobile phone. It is indicated that other components may be used herein. As can be seen, the structure of the output stage 200 in the example of FIG. 3 is an H-bridge circuit structure, thus the output stage 200 may be controlled by an H-bridge control stage 10. Namely, the switches S1, S2, S3, S4 of the output stage 200 may be controlled by the H-bridge control stage 10. In the case of audio subsystems, the H-bridge control stage 10 may be the control stage of a Class-D amplifier. If it is the case, the combination of a Class-D amplifier control stage and the output stage 200 of the FIG. 3 would correspond to the realisation of a Class-D amplifier.

Figure 4:
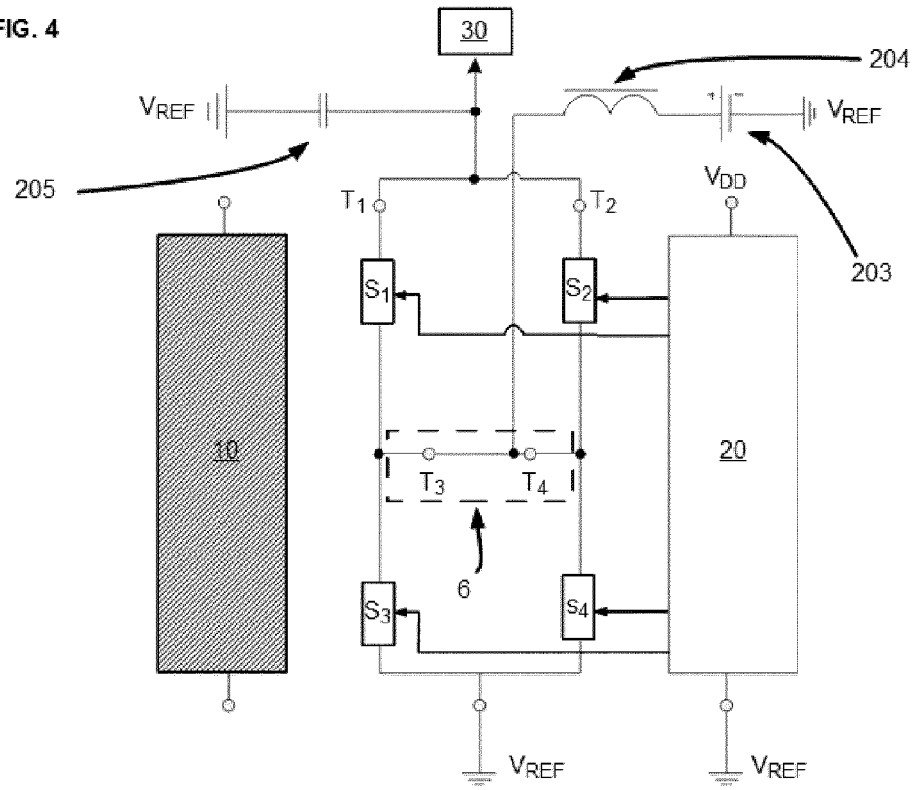

FIG. 4 is a block diagram schematically illustrating a second exemplary embodiment of the proposed solution wherein the output stage 200 of FIG. 2 is used, in the second operating state.

In the example of FIG. 4, the output stage 200 may further comprise one inductor 204 and one decoupling capacitor 205. Further, in FIG. 4, the first input/output terminal T1 and second input/output terminal T2 are configured to operate as output terminals and are also configured to be connected, in series with a load element 30 and, in parallel with the decoupling capacitor 205. In this configuration, the decoupling capacitor 205 is used for removing on-chip high frequency noise. Also, in FIG. 4, the third input/output terminal T3 and fourth input/output terminal T4 are short-circuited 6. Additionally, in FIG. 4, one end of the inductor 204 is configured to be connected to the short-circuit 6 and another end the inductor 204 is configured to be connected to a common node receiving a supply potential 203 similar to those already presented in FIG. 3. As can be seen, the structure of the output stage 200 in the example of FIG. 4 is not an H-bridge circuit structure since the load element is not on the central branch of the structure. Rather, the structure of the output stage 200 in the example of FIG. 4 may be seen as two branches 4, 5 which are arranged in parallel. Therefore, any control stage 20 that may control such structure may be used. In one embodiment, the control stage 20 may use the same signal to control two switches S1, S2, S3, S4 which are situated on parallel branches of the output stage 200 of the FIG. 4. In this case, the output stage 200 would be similar to a circuit structure comprising only a single branch. In this case, a DC-DC control stage may be used to control the output stage 200 in the example of FIG. 4. If it is the case, the combination of a DC-DC control stage and the output stage 200 of the FIG. 4 would correspond to the realisation of a DC-DC boost converter configured to, at least, step-up an input voltage.

Figure 5:
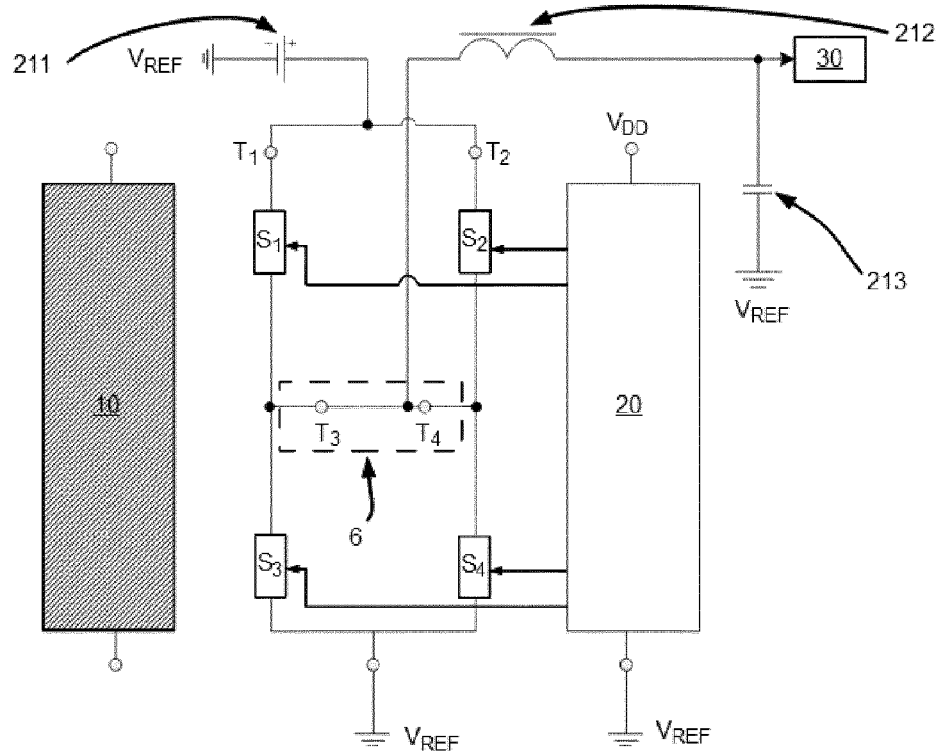

FIG. 5 is a block diagram schematically illustrating a third exemplary embodiment of the proposed solution wherein the output stage 200 of FIG. 2 is used, in the second operating state.

In the example of FIG. 5, the output stage 200 may further comprise one inductor 212 and one decoupling capacitor 213 similar to those already presented in FIG. 4. Further, in FIG. 5, the first input/output terminal T1 and second input/output terminal T2 are configured to operate as input terminals and are also configured to be connected to a common node receiving a supply potential 203 similar to those already presented in FIG. 3. Also, in FIG. 5, a short circuit 6 is created between the third input/output terminal T3 and fourth input/output terminal T4. Additionally, in FIG. 5, one end of the inductor 212 is configured to be connected to the short circuit 6 and another end the inductor 212 is configured to be connected, in series with a load element 30 and, in parallel with the decoupling capacitor 213. As can be seen, the structure of the output stage 200 in the example of FIG. 4 is not an H-bridge circuit structure since the load element 30 is not directed connected to the central branch of the structure. Rather, the structure of the output stage 200 in the example of FIG. 5 may be seen as having, mutatis mutandis, the same structure presented in FIG. 4. Thus, in one embodiment, the control stage 20 may be a DC-DC control stage which may be used to control the output stage 200 in the example of FIG. 5. If it is the case, the combination of a DC-DC control stage and the output stage 200 of the FIG. 5 would correspond to the realisation of a DC-DC buck converter configured to, at least, step-down an input voltage.

Figure 6:
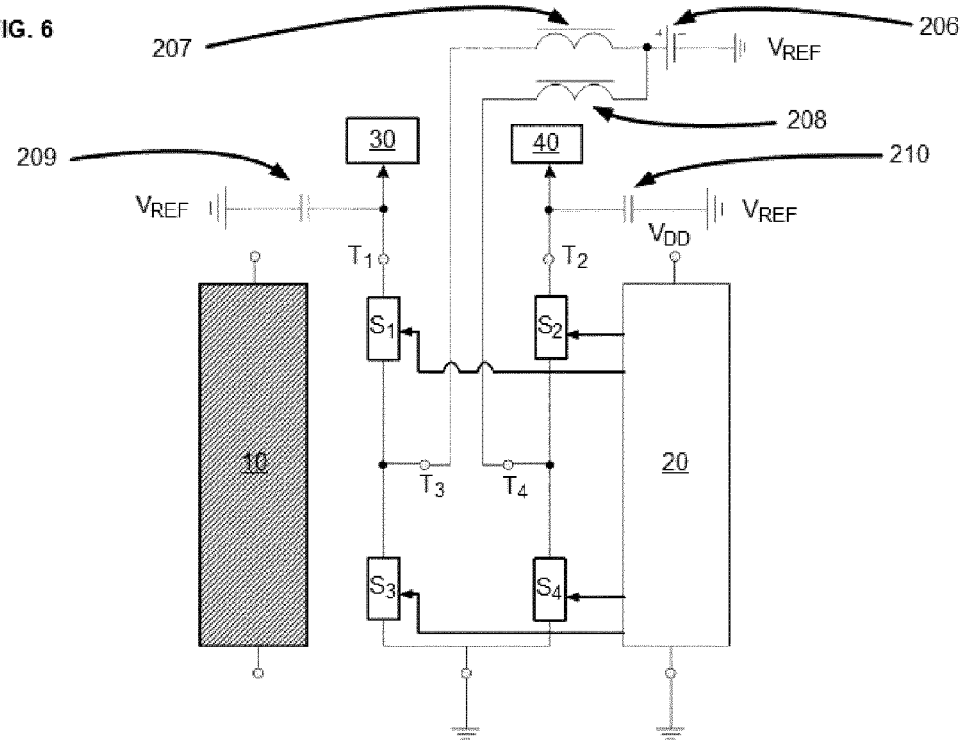

FIG. 6 is a block diagram schematically illustrating a fourth exemplary embodiment of the proposed solution wherein the output stage 200 of FIG. 2 is used, in the second operating state.

In the example of FIG. 6, the output stage 200 may further comprise one first inductor 207, one second inductor 208, one first decoupling capacitor 209 and one second decoupling capacitor 210. Further, in FIG. 6, the first input/output terminal T1 and second input/output terminal T2 are configured to operate as output terminals. The first input/output terminal T1 is further configured to be connected, in series with a first load element 30 and in parallel with the first decoupling capacitor 209. The second input/output terminal T2 is further configured to be connected, in series with a second load element 40 and in parallel with the second decoupling capacitor 210. Also, one end of the first inductor 207 is configured to be connected to the third input/output terminal T3 and another end of the first inductor 207 is configured to be connected to a common node receiving a supply potential 206 similar to those already presented in FIG. 3. Additionally, one end of the second inductor 208 is configured to be connected to the fourth input/output terminal T4 and another end of the second inductor 208 is configured to be connected to the above-mentioned common node receiving a supply potential 206. As can be seen, the structure of the output stage 200 in the example of FIG. 6 is not an H-bridge circuit structure since the load elements 30, 40 are not directed connected to the central branch of the structure. Rather, the structure of the output stage 200 in the example of FIG. 6 may be seen as having, mutatis mutandis, the same structure presented in FIG. 4. Thus, in one embodiment, the control stage 20 may be a DC-DC control stage which may be used to control the output stage 200 in the example of FIG. 6. If it is the case, the combination of a DC-DC control stage and the output stage 200 of the FIG. 6 would correspond to the realisation of a double DC-DC boost converter configured to, at least, step-up an input voltage. Also, due to the fact that each branch of the structure may be controlled independently by the control stage 20, using a DC-DC control stage enables to generate different voltage on each branch 4,5 of the output stage that may be used to supply in voltage the load elements 30, 40.

Figure 7:
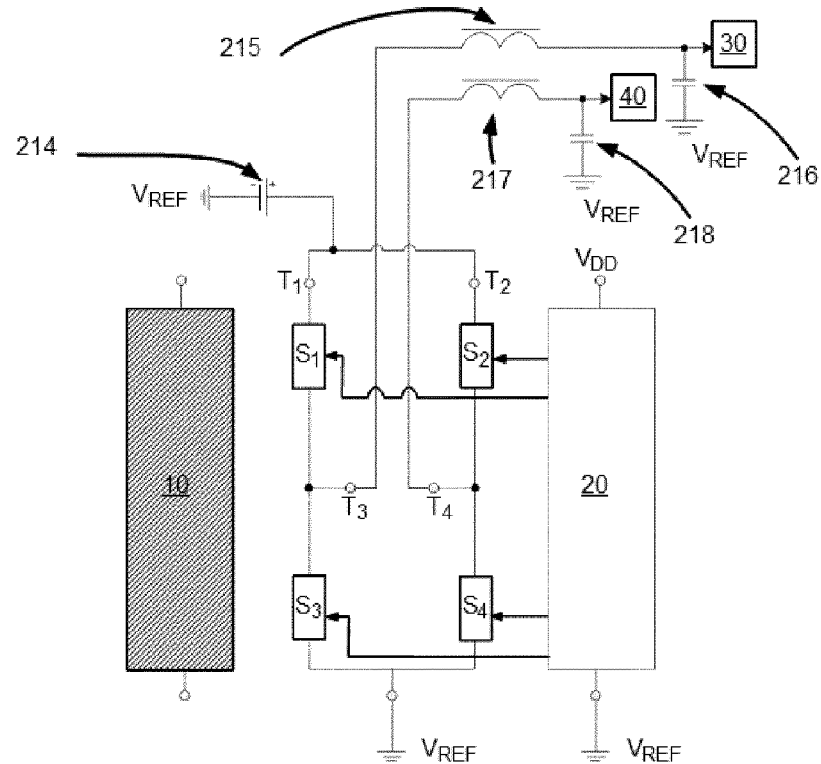

FIG. 7 is a block diagram schematically illustrating a fifth exemplary embodiment of the proposed solution wherein the output stage 200 of FIG. 2 is used, in the second operating state.

In the example of FIG. 7, the output stage 200 may further comprise one first inductor 215, one second inductor 217, one first decoupling capacitor 216 and one second decoupling capacitor 218. Further, in FIG. 7, the first input/output terminal T1 and second input/output terminal T2 are configured to operate as input terminals and are configured to be connected to a common node receiving a supply potential 214 similar to those already presented in FIG. 3. Also, one end of the first inductor 215 is configured to be connected to the third input/output terminal T3 and another end of the first inductor 215 is configured to be connected, in series with a first load element 30 and in parallel with the first decoupling capacitor 216. Additionally, one end of the second inductor 217 is configured to be connected to the fourth input/output terminal T4 and another end of the second inductor 217 is configured to be connected, in series with a second load element 40 and in parallel with the second decoupling capacitor 218. As can be seen, the structure of the output stage 200 in the example of FIG. 7 is not an H-bridge circuit structure since the load elements 30, 40 are not directed connected to the central branch of the structure. Rather, the structure of the output stage 200 in the example of FIG. 7 may be seen as having, mutatis mutandis, the same structure presented in FIG. 4. Thus, in one embodiment, the control stage 20 may be a DC-DC control stage which may be used to control the output stage 200 in the example of FIG. 7. If it is the case, the combination of a DC-DC control stage and the output stage 200 of the FIG. 7 would correspond to the realisation of a double DC-DC buck converter configured to, at least, step-down an input voltage. Also, due to the fact that each branch of the structure may be controlled independently by the control stage 20, using a DC-DC control stage enables to generate different voltage on each branch 4,5 of the output stage that may be used to supply in voltage the load elements 30, 40.

Figure 8:
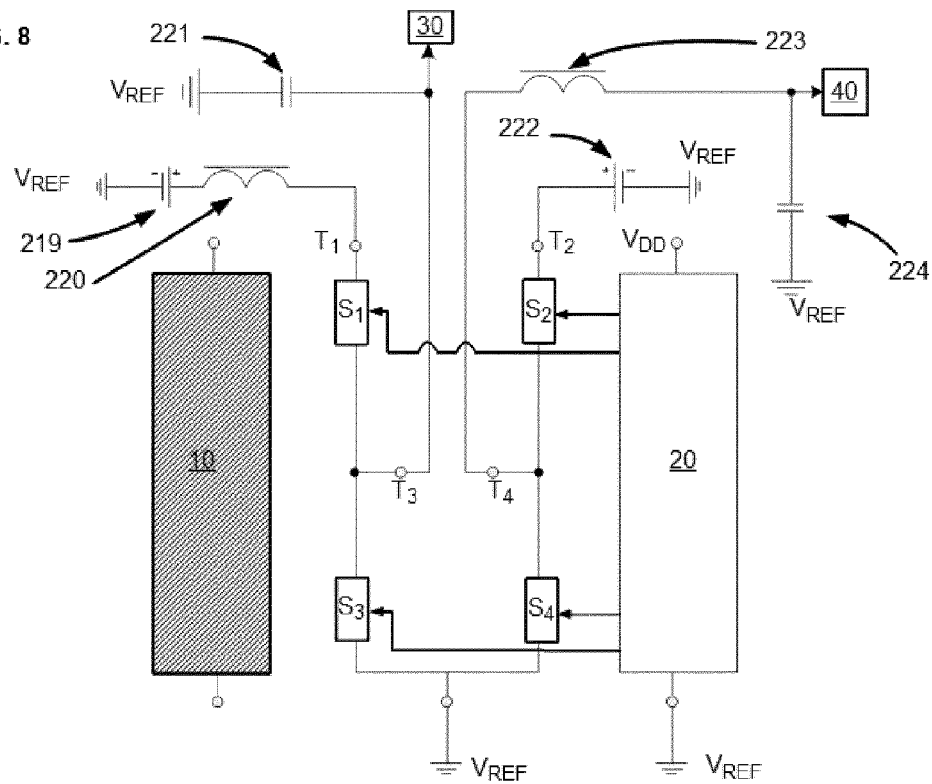

FIG. 8 is a block diagram schematically illustrating a sixth exemplary embodiment of the proposed solution wherein the output stage 200 of FIG. 2 is used, in the second operating state. Actually, the example of FIG. 8 may correspond to a mix between the circuit structures of the examples of FIGS. 6-7.

Namely, in the example of FIG. 8, the output stage 200 may further comprise one first inductor 220, one second inductor 223, one first decoupling capacitor 221 and one second decoupling capacitor 224. Further, in FIG. 8, the first input/output terminal T1 and second input/output terminal T2 are configured to operate as input terminals. The third input/output terminal T3 is configured to be connected, in series with a first load element 30 and in parallel with the first decoupling capacitor 221. Also, one end of the first inductor 220 is configured to be connected to the first input/output terminal T1 and another end of the first inductor 220 is configured to be connected to a first node receiving a supply potential 219 similar to those already presented in FIG. 3. Additionally, one end of the second inductor 223 is configured to be connected to the fourth input/output terminal T4 and another end of the second inductor 223 is configured to be connected, in series with a second load element 40 and in parallel with the second decoupling capacitor 224. As can be seen, the structure of the output stage 200 in the example of FIG. 8 is not an H-bridge circuit structure al already explained above. Rather, the structure of the output stage 200 in the example of FIG. 6 may be seen as having, mutatis mutandis, the same structure presented in FIGS. 6-7. Thus, in one embodiment, the control stage 20 may be a DC-DC control stage which may be used to control the output stage 200 in the example of FIG. 6. If it is the case, the combination of a DC-DC control stage and the output stage 200 of the FIG. 6 would correspond to the realisation of a DC-DC buck-boost converter configured to, at least, step-up an input voltage in the first branch 4 of the output stage 200 and step-down an input voltage in the second branch 5 of the output stage 200. This is mainly due to the fact that each branch of the structure may be controlled independently by the control stage 20, using a DC-DC control stage enables to generate different voltage on each branch 4,5 of the output stage that may be used to supply in voltage the load elements 30, 40.

In one embodiment, the switches S1, S2, S3, S4 may be controlled trough their respective control terminals based on control signals such a PWM signal which may be generated by a control stage 10, 20.

Several apparatuses such as control apparatuses may be realized based on the proposed solution. For example, a first control apparatus may comprise a control stage configured to control an output stage according to example of FIG. 3. In another example, a second control apparatus may comprise a control stage configured to control an output stage according to at least one of the examples of FIGS. 4-8.

Several uses and circuits may also be realized based on the proposed solution. In an example, a first circuit may comprise:

an output stage according to at least one of the examples of FIGS. 3-8;
the first control apparatus wherein the control stage of the first control apparatus is connected to the output stage; and,
the second control apparatus wherein the control stage of the second control apparatus is connected to the output stage;

wherein, when the control stage of the first control apparatus is connected to the output stage, the control stage of the second control apparatus is electrically disconnected from the output stage, the output stage being configured to operate in the first operating state; and,
when the control stage of the second control apparatus is connected to the output stage, the control stage of the first control apparatus is electrically disconnected from the output stage, the output stage being configured to operate in the second operating state.

In an example, such circuit may be used to drive a stereo hands free speaker. In that case, the first control apparatus may be a class-D controller and the second control apparatus may be a DC-DC controller. This way, in a first operating state of the output stage, the circuit may be configured to behave as a class-D amplifier according for instance to FIG. 3 wherein the load would be the stereo hands free speaker. In this case, the second control apparatus may be deactivated. In a second operating state of the output stage, the circuit may be configured to behave as a DC-DC converter. According to FIG. 4, for instance, the circuit may be a DC-DC boost converter where the load 30 would be the stereo hands free speaker. According to FIG. 5, for instance, the circuit may be a DC-DC buck converter where the load 30 would be the stereo hands free speaker. According to FIG. 6, for instance, the circuit may be a double DC-DC boost converter where the loads 30, 40 may be different terminals of the stereo hands free speaker. According to FIG. 7, for instance, the circuit may be a double DC-DC buck converter where the loads 30, 40 may be different terminals of the stereo hands free speaker. Finally, according to FIG. 8, for instance, the circuit may be a DC-DC buck-boost converter able to drive different loads 30, 40 for voltage step-up or step-down wherein at least one may be the stereo hands free speaker.

Several devices, such as portable devices, may also be realized based on the proposed solution. For example, a device may comprise:

the first circuit;

a battery configured to be connected to the input terminals of the circuit; and, a loudspeaker configured to be connected to the output terminals of the circuit.

Although the proposed solution is described above in terms of various exemplary embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the proposed solution, whether or not such embodiments are described and whether or not such features are presented as being a part of a described embodiment. Thus, the breadth and scope of the present proposed solution should not be limited by any of the above-described exemplary embodiments. For instance, it is to appreciated that the output and the circuit may be used in other industries different from the audio that has been presented throughout the description. For example, the DC-DC feature of the circuit may be used in motor-based applications.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more, least," "but not limited to" or other like phrases in some instances shall not be read to mean that the narrower case is intended or required in instances where such broadening phrases may be absent. Additionally, the various embodiments set forth herein are described in terms of exemplary block diagrams, flow charts and other illustrations. As will become apparent to one of ordinary skill in the art after reading this document, the illustrated embodiments and their various alternatives may be implemented without confinement to the illustrated examples. These illustrations and their accompanying description should not be construed as mandating a particular architecture or configuration.

The invention claimed is:

1. An output stage adapted to operate in at least a first operating state and a second operating state, the output stage comprising:

a first, a second, a third and a fourth configurable input/output terminals; and, a first, a second, a third and a fourth switches, each having a first main terminal, a second main terminal and a control terminal, the control terminal being adapted to receive a control signal for controlling the open or closed state of the switch, wherein, the first input/output terminal is connected to the first main terminal of the first switch;

the second input/output terminal is connected to the first main terminal of the second switch;

the second main terminal of the first switch is connected to the first main terminal of the third switch through a first branch, the second main terminal of the second switch is connected to the first main terminal of the fourth switch through a second branch;

the third input/output terminal is connected to the first branch and the fourth input/output terminal is connected to the second branch;

the second main terminals of the third and fourth switches are both connected to a common node receiving a reference potential; and, wherein, when the first and second input/output terminals are configured to operate as input terminals, the third and fourth input/output terminals are configured to operate as output terminals; and, when the first and second input/output terminals are configured to operate as output terminals, the third and fourth input/output terminals are configured to operate as input terminals; and, wherein, in the first operating state, the output stage is arranged in a first electrical configuration; and in the second operating state wherein the output stage is arranged in a second electrical configuration different from the first configuration.

2. The output stage of claim 1, wherein, in the first operating state:

the first and second input/output terminals are configured to operate as input terminals and are configured to be connected to a common node receiving a supply potential; and, the third and fourth input/output terminals are configured to be connected to a load element.

3. The output stage of claim 1 further comprising an inductor and a decoupling capacitor, wherein, in the second operating state:

the first and second input/output terminals are configured to operate as output terminals and are configured to be connected, in series with a load element and in parallel with the decoupling capacitor;

the third and fourth input/output terminals are short-circuited; and one end of the inductor is configured to be connected to the short-circuited third and fourth input/output terminals, and another end of the inductor is configured to be connected to a common node receiving a supply potential.

4. The output stage of claim 1 further comprising an inductor and a decoupling capacitor, wherein, in the second operating state:

the first and second input/output terminals are configured to operate as input terminals and are configured to be connected to a common node receiving a supply potential;

the third and fourth input/output terminals are short-circuited; and one end of the inductor is configured to be connected to the short-circuited third and fourth input/output terminals, and another end of the inductor is configured to be connected, in series with a load element and in parallel with the decoupling capacitor.

5. The output stage of claim 1 further comprising a first and second inductors and a first and second decoupling capacitors, wherein, in the second operating state:

the first and second input/output terminals are configured to operate as output terminals;

the first input/output terminal is configured to be connected, in series with a first load element and in parallel with the first decoupling capacitor;

the second input/output terminal is configured to be connected, in series with a second load element and in parallel with the second decoupling capacitor;

one end of the first inductor is configured to be connected to the third input/output terminal, and another end of the first inductor is configured to be connected to a common node receiving a supply potential; and one end of the second inductor is configured to be connected to the fourth input/output terminal, and another end of the second inductor is configured to be connected to the common node receiving a supply potential.

6. The output stage of claim 1 further comprising a first and second inductors, and a first and second decoupling capacitors, wherein, in the second operating state:

the first and second input/output terminals are configured to operate as input terminals and are configured to be connected to a common node receiving a supply potential;

one end of the first inductor is configured to be connected to the third input/output terminal, and another end of the first inductor is configured to be connected, in series with a first load element and in parallel with the first decoupling capacitor; and one end of the second inductor is configured to be connected to the fourth input/output terminal, and another end of the second inductor is configured to be connected, in series with a second load element and in parallel with the second decoupling capacitor.

7. The output stage of claim 1 further comprising a first and second inductors and a first and second decoupling capacitors, wherein, in the second operating state:

the first and second input/output terminals are configured to operate as input terminals;

the third input/output terminal is configured to be connected, in series with a first load element and in parallel with the first decoupling capacitor;

one end of the first inductor is configured to be connected to the first input/output terminal, and another end of the first inductor is configured to be connected to a first node receiving a supply potential; and one end of the second inductor is configured to be connected to the fourth input/output terminal, and another end of the second inductor is configured to be connected, in series with a second load element and in parallel with the second decoupling capacitor.

8. A control apparatus comprising:

a control stage configured to control an output stage adapted to operate in at least a first operating state and a second operating state, the output stage including:

a first, a second, a third and a fourth configurable input/output terminals; and, a first, a second, a third and a fourth switches, each having a first main terminal, a second main terminal and a control terminal, the control terminal being adapted to receive a control signal for controlling the open or closed state of the switch, wherein, the first input/output terminal is connected to the first main terminal of the first switch;

the second input/output terminal is connected to the first main terminal of the second switch;

the second main terminal of the first switch is connected to the first main terminal of the third switch through a first branch, the second main terminal of the second switch is connected to the first main terminal of the fourth switch through a second branch;

the third input/output terminal is connected to the first branch and the fourth input/output terminal is connected to the second branch;

the second main terminals of the third and fourth switches are both connected to a common node receiving a reference potential; and, wherein, when the first and second input/output terminals are configured to operate as input terminals, the third and fourth input/output terminal are configured to operate as output terminals; and, when the first and second input/output terminals are configured to operate as output terminals, the third and fourth input/output terminals are configured to operate as input terminals; and, wherein, in the first operating state, the output stage is arranged in a first electrical configuration; and in the second operating state wherein the output stage is arranged in a second electrical configuration different from the first configuration, and further wherein, in the first operating state, the first and second input/output terminals are configured to operate as input terminals and are configured to be connected to a common node receiving a supply potential; and the third and fourth input/output terminals are configured to be connected to a load element.

9. The control apparatus of claim 8 wherein the control stage is a Class-D control stage.

10. The control apparatus of claim 8, wherein the control stage is adapted to control the output stage by generating control signals for controlling the first, second, third and fourth switches through their respective control terminals.

11. A control apparatus comprising:

a control stage configured to control an output stage adapted to operate in at least a first operating state and a second operating state, the output stage including:

a first, a second, a third and a fourth configurable input/output terminals; and, a first, a second, a third and a fourth switches, each having a first main terminal, a second main terminal and a control terminal, the control terminal being adapted to receive a control signal for controlling the open or closed state of the switch, wherein,
the first input/output terminal is connected to the first main terminal of the first switch;
the second input/output terminal is connected to the first main terminal of the second switch;
the second main terminal of the first switch is connected to the first main terminal of the third switch through a first branch,
the second main terminal of the second switch is connected to the first main terminal of the fourth switch through a second branch;
the third input/output terminal is connected to the first branch and the fourth input/output terminal is connected to the second branch;
the second main terminals of the third and fourth switches are both connected to a common node receiving a reference potential; and,
wherein,
when the first and second input/output terminals are configured to operate as input terminals, the third and fourth input/output terminal are configured to operate as output terminals; and,
when the first and second input/output terminals are configured to operate as output terminals, the third and fourth input/output terminals are configured to operate as input terminals; and,
wherein,
in the first operating state, the output stage is arranged in a first electrical configuration; and
in the second operating state wherein the output stage is arranged in a second electrical configuration different from the first configuration, and,
the output stage further comprising an inductor and a decoupling capacitor,
and wherein, in the second operating state;
the first and second input/output terminals are configured to operate as output terminals and are configured to be connected, in series with a load element and in parallel with the decoupling capacitor;
the third and fourth input/output terminals are short-circuited; and
one end of the inductor is configured to be connected to the short-circuited third and fourth input/output terminals, and another end of the inductor is configured to be connected to a common node receiving a supply potential.

12. The control apparatus of claim 11 wherein the control stage is a DC-DC converter control stage.

13. A circuit comprising:
an output stage adapted to operate in at least a first operating state and a second operating state, the output stage including:
a first, a second, a third and a fourth configurable input/output terminals; and,
a first, a second, a third and a fourth switches, each having a first main terminal, a second main terminal and a control terminal, the control terminal being adapted to receive a control signal for controlling the open or closed state of the switch,
wherein,
the first input/output terminal is connected to the first main terminal of the first switch;
the second input/output terminal is connected to the first main terminal of the second switch;
the second main terminal of the first switch is connected to the first main terminal of the third switch through a first branch,
the second main terminal of the second switch is connected to the first main terminal of the fourth switch through a second branch;
the third input/output terminal is connected to the first branch and the fourth input/output terminal is connected to the second branch;
the second main terminals of the third and fourth switches are both connected to a common node receiving a reference potential; and,
wherein,
when the first and second input/output terminals are configured to operate as input terminals, the third and fourth input/output terminal are configured to operate as output terminals; and,
when the first and second input/output terminals are configured to operate as output terminals, the third and fourth input/output terminals are configured to operate as input terminals; and,
wherein,
in the first operating state, the output stage is arranged in a first electrical configuration; and
in the second operating state wherein the output stage is arranged in a second electrical configuration different from the first configuration, and,
further wherein, in the first operating state,
the first and second input/output terminals are configured to operate as input terminals and are configured to be connected to a common node receiving a supply potential; and
the third and fourth input/output terminals are configured to be connected to a load element;
a first control apparatus wherein a control stage of the first control apparatus is connected to the output stage; and,
a second control apparatus wherein a control stage of the second control apparatus is connected to the output stage;
wherein,
when the control stage of the first control apparatus is connected to the output stage, the control stage of the second control apparatus is electrically disconnected from the output stage, the output stage being configured to operate in the first operating state; and,
when the control stage of the second control apparatus is connected to the output stage, the control stage of the first control apparatus is electrically disconnected from the output stage, the output stage being configured to operate in the second operating state.

14. A device comprising:
a circuit comprising a control apparatus that includes a control stage configured to control an output stage adapted to operate in at least a first operating state and a second operating state, the output stage including:
a first, a second, a third and a fourth configurable input/output terminals; and,
a first, a second, a third and a fourth switches, each having a first main terminal, a second main terminal and a control terminal, the control terminal being adapted to receive a control signal for controlling the open or closed state of the switch,
wherein,
the first input/output terminal is connected to the first main terminal of the first switch;
the second input/output terminal is connected to the first main terminal of the second switch;

the second main terminal of the first switch is connected to the first main terminal of the third switch through a first branch, the second main terminal of the second switch is connected to the first main terminal of the fourth switch through a second branch;

the third input/output terminal is connected to the first branch and the fourth input/output terminal is connected to the second branch;

the second main terminals of the third and fourth switches are both connected to a common node receiving a reference potential; and, wherein, when the first and second input/output terminals are configured to operate as input terminals, the third and fourth input/output terminal are configured to operate as output terminals; and when the first and second input/output terminals are configured to operate as output terminals, the third and fourth input/output terminals are configured to operate as input terminals; and, wherein, in the first operating state, the output stage is arranged in a first electrical configuration; and in the second operating state wherein the output stage is arranged in a second electrical configuration different from the first configuration, and, further wherein, in the first operating state, the first and second input/output terminals are configured to operate as input terminals and are configured to be connected to a common node receiving a supply potential; and the third and fourth input/output terminals are configured to be connected to a load element, and wherein the control stage is adapted to control the output stage by generating control signals for controlling the first, second, third and fourth switches through their respective control terminals;

a battery configured to be connected to the input terminals of the circuit; and a loudspeaker configured to be connected to the output terminals of the circuit.

15. An apparatus comprising:

an output stage adapted to operate in at least a first operating state and a second operating state, the output stage including:

a first, a second, a third and a fourth configurable input/output terminals; and, a first, a second, a third and a fourth switches, each having a first main terminal, a second main terminal and a control terminal, the control terminal being adapted to receive a control signal for controlling the open or closed state of the switch, wherein, the first input/output terminal is connected to the first main terminal of the first switch;

the second input/output terminal is connected to the first main terminal of the second switch;

the second main terminal of the first switch is connected to the first main terminal of the third switch through a first branch, the second main terminal of the second switch is connected to the first main terminal of the fourth switch through a second branch;

the third input/output terminal is connected to the first branch and the fourth input/output terminal is connected to the second branch;

the second main terminals of the third and fourth switches are both connected to a common node receiving a reference potential; and, wherein, when the first and second input/output terminals are configured to operate as input terminals, the third and fourth input/output terminal are configured to operate as output terminals; and, when the first and second input/output terminals are configured to operate as output terminals, the third and fourth input/output terminals are configured to operate as input terminals; and, wherein, in the first operating state, the output stage is arranged in a first electrical configuration; and in the second operating state wherein the output stage is arranged in a second electrical configuration different from the first configuration, and further wherein, in the first operating state, the first and second input/output terminals are configured to operate as input terminals and are configured to be connected to a common node receiving a supply potential; and the third and fourth input/output terminals are configured to be connected to a load element, and the output stage connected to:

a first control apparatus, a control stage of the first control apparatus being connected to the output stage; or to a second control apparatus, a control stage of the second control apparatus being connected to the output stage;

wherein, when the control stage of the first control apparatus is connected to the output stage, the control stage of the second control apparatus is electrically disconnected from the output stage, the output stage being configured to operate in the first operating state; and, when the control stage of the second control apparatus is connected to the output stage, the control stage of the first control apparatus is electrically disconnected from the output stage, the output stage being configured to operate in the second operating state.

* * * * *